United States Patent
De Paiva Sá et al.

(10) Patent No.: US 11,322,632 B2
(45) Date of Patent: May 3, 2022

(54) ULTRA-THIN PLASMONIC SOLAR CELLS, METHODS FOR THEIR MANUFACTURE AND USE

(71) Applicant: Peafowl Solar Power AB, Uppsala (SE)

(72) Inventors: Jacinto De Paiva Sá, Uppsala (SE); Marina Freitag, Uppsala (SE)

(73) Assignee: PEAFOWL SOLAR POWER AB, Uppsala (SE)

(*) Notice: Subject to any disclaimer, the term of this patent is extended or adjusted under 35 U.S.C. 154(b) by 0 days.

(21) Appl. No.: 16/499,249

(22) PCT Filed: Mar. 28, 2018

(86) PCT No.: PCT/EP2018/057923
§ 371 (c)(1),
(2) Date: Sep. 28, 2019

(87) PCT Pub. No.: WO2018/178153
PCT Pub. Date: Oct. 4, 2018

(65) Prior Publication Data
US 2020/0111620 A1    Apr. 9, 2020

(30) Foreign Application Priority Data
Mar. 31, 2017  (WO) .................. PCT/IB2017/000385

(51) Int. Cl.
*H01L 31/054* (2014.01)
*H01G 9/20* (2006.01)
(Continued)

(52) U.S. Cl.
CPC ......... *H01L 31/054* (2014.12); *H01G 9/2031* (2013.01); *H01L 31/032* (2013.01);
(Continued)

(58) Field of Classification Search
CPC .............. H01G 9/2031; H01L 51/0098; H01L 51/0595; H01L 51/4226; H01L 31/054;
(Continued)

(56) References Cited

U.S. PATENT DOCUMENTS

2009/0188558 A1   7/2009  Jen
2013/0327386 A1*  12/2013  Xu ....................... H01G 9/2036
                                                      136/256

(Continued)

FOREIGN PATENT DOCUMENTS

EP    1630883 A2   3/2006
EP    3006604 A1   4/2016
(Continued)

OTHER PUBLICATIONS

Nakamura et al., "Properties of Plasmon-Induced Photoelectric Conversion on a TiO2/NiO p-n junction with Au nanoparticles", J. Phys. Chem. Lett. 2016.*

(Continued)

*Primary Examiner* — Lindsey A Bernier
(74) *Attorney, Agent, or Firm* — Tucker Ellis LLP

(57) ABSTRACT

An ultra-thin and highly transparent wafer-type plasmonic solar cell comprising a layer of a conductive transparent substrate, a layer of an n-type semiconductor; a layer made of metal nanoparticles selected from the group consisting of copper, gold or silver and a layer made of a p-type semiconductor; wherein the substrate, n-type semiconductor, metal nanoparticles and p-type semiconductor respectively are linked by covalent bonds by means of one or more molecular linker/linkers. A method for producing said plasmonic solar cell by self-assembly.

22 Claims, 10 Drawing Sheets

Figure 1:
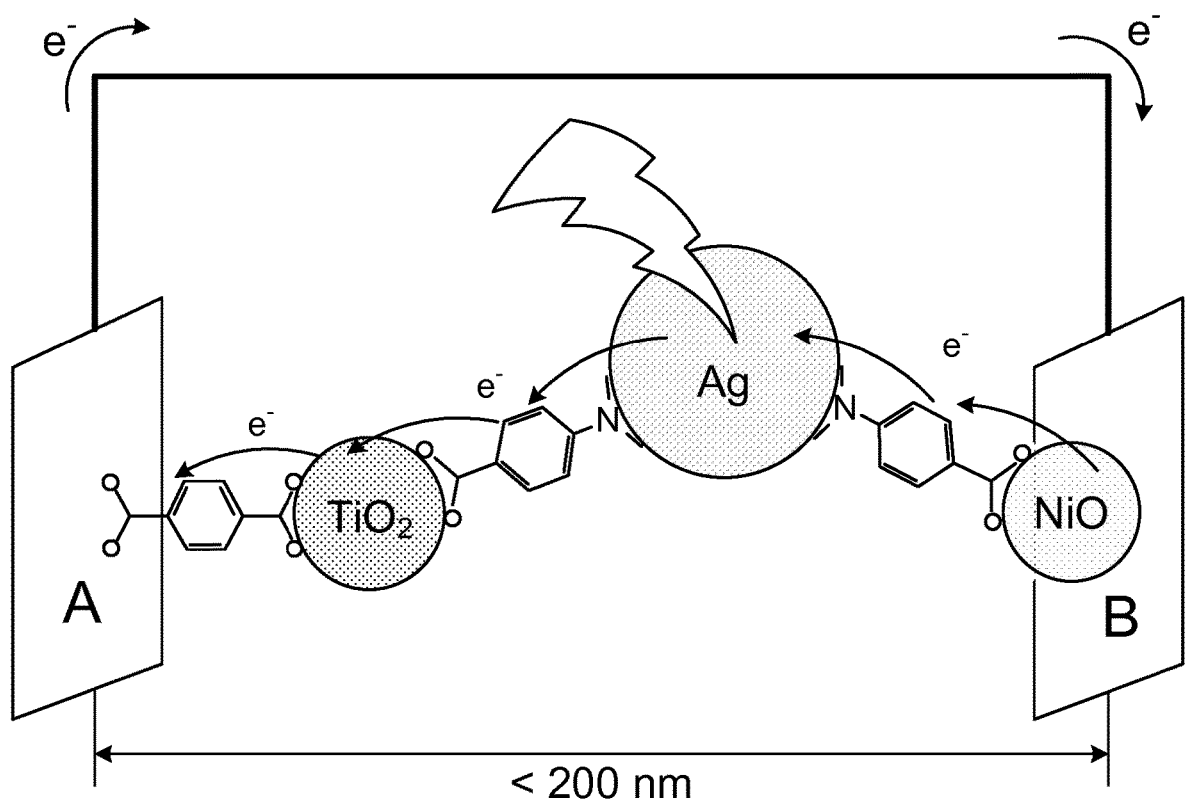

(51) Int. Cl.
  *H01L 31/032* (2006.01)
  *H01L 31/055* (2014.01)
  *H01L 31/18* (2006.01)
  *H01L 31/048* (2014.01)
  *H01L 51/42* (2006.01)
  *H01L 51/44* (2006.01)
  *H02S 20/22* (2014.01)
  *H01L 51/00* (2006.01)

(52) U.S. Cl.
  CPC ........ *H01L 31/048* (2013.01); *H01L 31/0481* (2013.01); *H01L 31/055* (2013.01); *H01L 31/18* (2013.01); *H01L 51/4233* (2013.01); *H01L 51/442* (2013.01); *H02S 20/22* (2014.12); *H01L 51/0098* (2013.01)

(58) Field of Classification Search
  CPC ............... H01L 31/048; H01L 31/0481; H01L 51/4233; H01L 51/442; Y02B 10/10; Y02E 10/52; Y02E 10/542; H02S 20/22
  See application file for complete search history.

(56) References Cited

U.S. PATENT DOCUMENTS

2014/0360564 A1* 12/2014 Ng ........................ H01G 9/2072
                                                                136/254
2015/0278321 A1* 10/2015 Vasantham ....... G06F 16/24552
                                                                707/634
2016/0343887 A1* 11/2016 Hossain .................... C22F 1/14

FOREIGN PATENT DOCUMENTS

| | | |
|---|---|---|
| JP | 2002353488 A | 12/2002 |
| JP | 2006032689 A | 2/2006 |
| JP | 2015134703 A | 7/2015 |
| JP | 2016027634 A | 2/2016 |
| JP | 2016162890 A | 9/2016 |
| KR | 20140055876 A | 5/2014 |

OTHER PUBLICATIONS

Konstantatos et al., "Molecular interfaces for plasmonic hot electron photovoltaics", Nanoscale 2014.*
Parameshwaran et al., "Green synthesis of silver nanoparticles using Beta Vulgaris", Materials Chemistry and Physics, 2013.*
F. Pelayo Garcia de Arquer et al. "Molecular interfaces for plasmonic hot electron photovoltaics", Nanoscale, vol. 7, Jan. 2, 2015, pp. 2281-2287.
International Search Report and Written Opinion from corresponding International Application No. PCT/EP2018/057923, dated Jul. 19, 2018, 9 pages.
R. Parameshwaran et al.: "Green synthesis of silver nanoparticles using Beta vulgaris: Role of process conditions on size distribution and surface structure", Materials Chemistry and Physics; dated Jan. 7, 2013, vol. 140 (2013), pp. 135-147.
Keisuke Nakamura et al.: "Properties of Plasmon-Induce D Photoelectric Conversion on a TiO2/NiO p-n Junction with Au Nanoparticles"; The Journal of Physical Chemistry Letters; dated Feb. 26, 2016, vol. 7, pp. 1004-1009.
F. Pelayo Garcia de Arguer et al.: "Molecular interfaces for plasmonic hot electron photovoltaics", Royal Society of Chemistry; Nanoscale, DOI:10.1039/c4nr06356b, dated 2015, vol. 7, pp. 2281-2288.
Japanese Office Action from corresponding Japanese Application No. 2019-554396, dated May 18, 2021, 9 pages.

* cited by examiner

ULTRA-THIN PLASMONIC SOLAR CELLS, METHODS FOR THEIR MANUFACTURE AND USE

TECHNICAL FIELD

The present disclosure relates to the field of photovoltaics, and in particular to new ultra-thin and highly transparent wafer-type plasmonic solar cells and methods for their manufacture.

BACKGROUND

Photovoltaics, the process of converting sunlight directly into electricity, has the potential to make a significant contribution to satisfying the global energy requirements. There are however unsolved issues related to sustainability and cost that must be addressed with increased urgency. Affordable, efficient, safe, stable, and abundant photovoltaic devices will dramatically contribute to renewable energy being integrated to meet the current energy demand and lead to a resource efficient society.

Presently, the mainstream trend consists in reducing the thickness of the wafer-based solar cells at a minimized efficiency loss, in order to save costs. Another trend is the effort to replace toxic elements in the formulations. Both these improvements, when successful, will spur new uses and applications, such as high performance solar cells that harvest a broader range of the sun's energy (so called tandem solar cells), photon-energy up-conversion, building-integrated photovoltaics, wearable electronics, solar powered sensors and electronic gadgets in homes. In the past few decades, the wafer thickness has been reduced from about 400 µm down to about 2-3 µm and this trend continues.

Thin-film solar cells usually have a thickness in the range of 1-2 µm, and are deposited on substrates such as glass, plastic or stainless steel. They provide cost-effective and efficient solutions as a feasible alternative to other energy sources, being set to meet particularly challenging demands such as portable and lightweight consumer applications, self-charging devices, tandem cells, etc.

A tandem cell consists of two or more sub-cells that together convert more of the sunlight spectrum into electricity and therefore increase the overall cell efficiency. The sub-cells are connected on top of one another and can be constructed from different solar cell materials or from the same family of solar cell material. For example, a tandem cell combining perovskite as the "upper cell" with either silicon or CIGS (copper indium gallium selenide) based "bottom" cells was predicted to be able to increase the electricity generation up to 20%.

The current world record in efficiency was achieved in June 2016 with a CIGS thin-film photovoltaic cell that had an energy conversion efficiency of 22.6%, as confirmed by the Fraunhofer Institute for Solar Energy Systems ISE, Freiburg, Germany. The cell had a thickness in the range of 3-4 µm and was manufactured by ZSW (Zentrum für Sonnenenergie- and Wasserstoff-Forschung, the Center for Solar Energy and Hydrogen Research, Baden-Württemberg) in Stuttgart, Germany. However, the current thickness of the film precludes its use in self-charging devices and colorless building integration.

Next to the widely commercialized semiconductor technologies based on crystalline and thin film, Si-based solar cells, alternative photovoltaics are emerging. Apart from thin-film systems like CuInGaSe$_2$ (i.e. CIGS), CdTe, GaAs and CuInSe$_2$, as well as organic and perovskites semiconductors, there has been a growing interest in the development of plasmonic solar cells.

The main limitation for current technologies is related to the low absorbance of near-bandgap light. Metal nanoparticles are strong scatterers of light at wavelengths near the plasmon resonance. This is due to a collective oscillation of the conduction electrons in the metal. At the localized surface plasmon (LSP) resonance the scattering cross-section can surpass the geometrical cross section of the particle. In such a case, to first-order, a substrate covered with a 10% areal density of particles could fully absorb and scatter the incident light. It can be noted, as an example, that small silver nanoparticles in the air have a scattering cross-section that is around ten times the actual cross-sectional area of the particle.

Sá et al. (*Energy Environ. Sci.* 6 (2013) 3584) demonstrated that electron-hole pairs are created during LSP excitation, measured by high-resolution X-ray absorption spectroscopy at the Au L$_3$-edge. LSP excitation caused an upward shift of the ionization energy threshold by about 1.0 eV, and an increase of Au d-band hole population, consistent with the formation of hot electrons, and their promotion to high-energy states.

Conceptually, plasmonic nanostructures can be used directly in solar cells but the photo-generated electron-hole pairs are short-lived (a few fs). This makes it problematic to draw current from the device. Thus, to increase charge separation lifetime, the charge carriers can be confined to spatially separated sites where reactions will take place, e.g., by transferring them to a semiconductor (analogous to dye-sensitized solar cells). LSP hot electrons have sufficient energy to be injected into TiO$_2$ conduction band, which extends their lifetime from few fs to 100s of ns.

The plasmon resonance is affected by particle morphology and the local dielectric environment. Thus, the efficiency of different solar cell geometries using metal nanoparticles within the active layers of solar cells is affected by the distance between the light absorber and the semiconductor. The overall effect of varying the distance is thus a tradeoff between increased cross section and reduced coupled fraction, which means that the optimum distance is determined by the absorption co-efficient of the semiconductor layer, the desired particle density (which is related to the cross section) and the degree of Ohmic loss in the particles.

Zhang et al. (*Sci. Rep.* 4 (2014) 4939) disclosed that Ag or Al nanoparticles (NPs) integrated Silicon ultra-thin solar cells having a wafer thickness of 5 µm can potentially achieve 15.3% efficiency. However, the current thickness of the film precludes its use in self-charging devices and colorless building integration.

Islam et al. (Solar Energy 103 (2014) 263-268) investigated the effect of gold nanoparticles on the performance of hydrogenated amorphous silicon (a-Si:H) solar cells, noting that the plasmonic effect of the Au nanoparticles allows for additional scattering at the surface thus reducing the overall reflectivity. The larger the nanoparticle size the more scattering is obtained and the median reflectivity drops from about 23% to 18%. Their results showed an increase in the short-circuit current density (Jsc) and efficiency with increasing nanoparticle size. The Jsc increased from 9.34 to 10.1 mA/cm$^2$. In addition, the efficiency increases from 4.28% to 5.01%.

US 2009/0188558 discloses photovoltaic devices having metal oxide electron-transport layers, and using bifunctional organic compounds in the electron-transport layers. This disclosure however does not consider plasmonic solar cells, and also not the use of metal nanoparticles as light absorbers. Where nanoparticles are discussed in the '558 document, this relates to the metal oxides, mainly zinc oxide.

SUMMARY

It is one aim of the present disclosure to provide an ultra-thin wafer type plasmonic solar cell, which is easy to assemble, stable, environmentally compatible, and which preferably also is highly transparent. Such solar cells are suitable for self-charging technologies, colorless building integration, wearable electronics, for powering sensors and electronic gadgets in homes, and also in high-efficiency tandem solar cells and photon-energy up-conversion, to mention a few non-limiting examples.

Another aim is to provide a process for the production of ultra-thin and preferably highly transparent wafer type solar cells, which process is simple, reliable and preferably also environmentally compatible.

According to a first aspect, the present disclosure makes available a plasmonic solar cell comprising
a layer of an n-type semiconductor;
a layer of metal nanoparticles selected from the group consisting of copper, gold, silver or aluminium; and
a layer of a p-type semiconductor;
the above layers sandwiched between a substrate and a back contact; wherein the substrate, n-type semiconductor, metal nanoparticles, p-type semiconductor and back contact respectively are linked by covalent bonds by means of one or more molecular linker or linkers.

According to a preferred embodiment of said first aspect, the n-type semiconductor layer has a thickness of about 30 nm or less, preferably 20 nm or less, more preferably 18 nm or less, e.g. 16 nm, 14 nm, 12 nm or less.

According to another preferred embodiment of said first aspect, freely combinable with the above, the p-type semiconductor layer has a thickness of about 30 nm or less, preferably 20 nm or less, more preferably 18 nm or less, e.g. 16 nm, 14 nm, 12 nm or less.

According to yet another embodiment, freely combinable with any of the above embodiments, the n-type semiconductor is chosen from $TiO_2$, $ZnO$, $SnO_2$, $SrTiO_3$, or a combination thereof, and preferably consists substantially of $TiO_2$.

According to yet another embodiment, freely combinable with any of the above embodiments, the p-type semiconductor is chosen from $NiO$, $CuXO_2$, wherein X=Al, Cr, Ga, Fe, and combinations thereof, and preferably consists substantially of $NiO$.

According to yet another embodiment of said first aspect, freely combinable with any of the above, the substrate, such as the conductive substrate, is chosen from indium tin oxide, fluorinated tin oxide and conductive polymers. Preferably at least one of the substrate or back contact is a transparent conductive substrate.

According to another preferred embodiment, also freely combinable with any of the above embodiments, the metal nanoparticles are silver nanoparticles.

According to preferred embodiment, freely combinable with any of the above embodiments, said metal nanoparticles are stabilized with a stabilizing agent, preferably betanin or a betanin derivative.

Preferably a solar cell according to said first aspect further comprises an insulating layer, preferably a layer comprising an oxide chosen from $Al_2O_3$ or $SiO_2$ or amorphous $TiO_2$.

According to a further embodiment, freely combinable with any of the above embodiments, said one or more molecular linker (linkers) is (are) chosen from aromatic derivatives or short carbon chain (up to $C_6$) organic compounds and derivatives having at least one functional group for coordination to semiconductors and at least one amine or thiol group for coordination to the metal nanoparticles.

One group of molecular linkers are chosen such, that they are capable of modifying at least one surface of a substrate or back contact, for example a metal oxide surface, and linking this to the surface of the semiconductors. Linkers capable of forming self-assembled monolayers having electron-transporting properties are preferred. These linkers have a general formula

Y—P—Z wherein Y and Z are functional groups that interact with or bond the surface of the substrate or back electrode linking or connecting it to the semiconductor.

In this first group of molecular linkers, representative functional groups of Y and Z include for example carboxylic acid groups (carboxylates, $-CO_2^{31}$), phosphonic acid groups (phosphates, $-PO_3^{2-}$), sulfonic acid groups (sulfonates, $-SO_3^{2-}$), phenolic groups (dihydroxyphenols or catechols), and siloxane groups (Si—O).

Further, P represents an organic group, such as an alkyl, aryl, or heteroaryl group, including substituted alkyl, aryl, and hetero aryl groups, fullerene or derivative thereof. P groups with electron-transporting properties are preferred, and such electron-transporting properties typically arise in functionalized π-conjugated compounds.

Another group of molecular linkers are chosen such, that they are capable of modifying at least one surface of the semiconductors surface and linking this to the metallic nanoparticles. Linkers capable of forming self-assembled monolayers having electron-transporting properties are preferred. These linkers have a general formula

X—P—W wherein X is a functional group that interacts with or bonds to the surface of metallic nanoparticles and W to the semiconductor.

In this second group of molecular linkers, representative functional groups of X include thiol (e.g. SH or SR, where R is $C_1$-$C_6$ alkyl), amino (e.g. $NH_2$, NHR, or $NR_2$, where R is $C_1$-$C_6$ alkyl).

Further, representative functional groups of W include carboxylic acid groups (carboxylates, $-CO_2^-$), phosphonic acid groups (phosphates, $-PO_3^{2-}$), sulfonic acid groups (sulfonates, $-SO_3^{2-}$), phenolic groups (dihydroxyphenols or catechols), and siloxane groups (Si—O). P is an organic group, such as an alkyl, aryl, or heteroaryl group, including substituted alkyl, aryl, and hetero aryl groups, fullerene or derivative thereof. P groups with electron-transporting properties are preferred, and such electron-transporting properties typically arise in functionalized π-conjugated compounds.

A third group of molecular linkers are chosen such, that they are capable of modifying at least one surface of the metallic surface of a substrate or back contact and linking this to the surface of the semiconductor. Again, linkers capable of forming self-assembled monolayers having electron-transporting properties are preferred. These linkers also have the general formula

X—P—W wherein X is a functional group that interacts with or bonds to the surface of a metallic substrate or back contact and W to the semiconductor.

In this third group, representative functional groups of X include thiol (e.g. SH or SR, where R is $C_1$-$C_6$ alkyl), amino (e.g. $NH_2$, NHR, or $NR_2$, where R is $C_1$-$C_6$ alkyl). Representative functional groups of W include carboxylic acid groups (carboxylates, —$CO_2^-$), phosphonic acid groups (phosphates, —$PO_3^{2-}$), sulfonic acid groups (sulfonates, —$SO_3^{2-}$), phenolic groups (dihydroxyphenols or catechols), and siloxane groups (Si—O).

Further, P is an organic group, such as an alkyl, aryl, or heteroaryl group, including substituted alkyl, aryl, and hetero aryl groups, fullerene or derivative thereof. P groups with electron-transporting properties are preferred, and such electron-transporting properties typically arise in functionalized π-conjugated compounds.

In practice, one or more linkers belonging to one or more of the above first, second and third groups is/are used. Thus, the first, second and third linker can be the same or different.

Preferably said molecular linker is chosen from 4-aminobenzoic acid (pABA), 4-mercaptobenzoic acid, 3-aminobenzoic acid, 3-mercaptobenzoic acid, 4-forylbenzoic acid (pFBA), (4-aminobenzyl)phosphonic acid, 2-aminobenzoic acid, 2-mercaptobenzoic acid, terephthalic acid, 4'-amino-[1,1'-biphenyl]-4-carboxylic acid, naphthalene derivatives and polyaromatic derivatives.

Non-limiting examples of molecular linkers are shown in Table 1 below:

TABLE 1

Examples of molecular linkers

| Chemical name | Formula |
|---|---|
| 4-aminobenzoic acid (pABA) | |
| 4-mercaptobenzoic acid (IUPAC: 4-sulfanylbenzoic acid) | |
| 3-aminobenzoic acid | |
| 3-mercaptobenzoic acid | |
| 4-formylbenzoic acid (pFBA) | |
| 4-aminobenzyl phosphonic acid | |
| 2-aminobenzoic acid (anthralinic acid) | |
| 2-mercaptobenzoic acid (thiosalisylic acid) | |
| 1,4-benzenedicarboxylic acid (terephtalic acid) | |
| 4'-amino-[1,1'-biphenyl]-4-carboxylic acid | |
| naphtalene derivatives | R = —$NH_2$, —SH |
| polyaromatic derivatives | n = 3, 4, 5 R = —$NH_2$, —SH |

Another aspect relates to a method for producing a plasmonic solar cell, preferably an ultra thin wafer type solar cell wherein a substrate, n-type semiconductor, metal nanoparticles, p-type semiconductor, and back contact respectively are linked by covalent bonds by means of one or more molecular linkers, said method comprising the steps of:

i) modifying a conductive substrate with a monolayer of an organic molecular linker by submersing it in an solution with the linker, and coating it with a layer of a semiconductor which is either n-type or p-type, ii) modifying metal nanoparticles with a molecular linker, iii) grafting the modified metal nanoparticles from step ii) to the modified conductive substrate from step i), iv) submersing the substrate from step iii) in a solution of a semiconductor of p-type when the semiconductor in step i) is n-type, and n-type, when the semiconductor in step i) is p-type, v) evaporating a back contact conductive layer on top of the semiconductor of step iv) with a layer thickness preferably of about 50 to 100 nm, and optionally applying the layers formed in steps i)-v) to a second substrate.

According to a preferred embodiment of said second aspect, the layer comprising an n-type semiconductor layer has a thickness of about 30 nm or less, preferably 20 nm or less, more preferably 18 nm or less, e.g. 16 nm, 14 nm, 12 nm or less.

According to another preferred embodiment of said second aspect, freely combinable with the above, the layer comprising a p-type semiconductor layer has a thickness of about 30 nm or less, preferably 20 nm or less, more preferably 18 nm or less, e.g. 16 nm, 14 nm, 12 nm or less.

According to yet another embodiment of said second aspect, freely combinable with any of the above, the n-type semiconductor is chosen from $TiO_2$, ZnO, $SnO_2$, $SrTiO_3$ or combinations thereof, and preferably it consists substantially of $TiO_2$.

According to yet another embodiment of said second aspect, freely combinable with any of the above, the p-type semiconductor is chosen from NiO, $CuXO_2$, wherein X=Al, Cr, Ga, Fe, and combinations thereof, and preferably consists substantially of NiO.

According to yet another embodiment of said second aspect, freely combinable with any of the above, the substrate is chosen from indium tin oxide, fluorinated tin oxide and conductive polymers.

According to an embodiment of said second aspect, freely combinable with any of the above, the metal nanoparticles are chosen from copper, gold, silver or aluminium nanoparticles.

According to a further embodiment of said second aspect, freely combinable with any of the above, the metal nanoparticles are silver nanoparticles. In one embodiment, the layer of silver nanoparticles has a thickness in the range of about 20 to about 250 nm. This has the advantage of the layer absorbing incoming light of the entire solar spectrum.

According to a further embodiment of said second aspect, freely combinable with any of the above, the metal nanoparticles are stabilized with a stabilizing agent, preferably betanin or a betanin derivative.

According to yet another embodiment of said second aspect, said at least one of the substrate or back contact is a transparent substrate, preferably a transparent conductive substrate.

One group of molecular linkers are chosen such, that they are capable of modifying at least one surface of the substrate or back contact, for example a metal oxide surface, and linking this to the surface of the semiconductors. Linkers capable of forming self-assembled monolayers having electron-transporting properties are preferred. These linkers have a general formula

Y—P—Z wherein Y and Z are functional groups that interact with or bond to the surface of the substrate or back contact to the semiconductor.

In this first group of molecular linkers, representative functional groups of Y and Z include for example carboxylic acid groups (carboxylates, —$CO_2^-$), phosphonic acid groups (phosphates, —$PO_3^{2-}$), sulfonic acid groups (sulfonates, —$SO_3^{2-}$), phenolic groups (dihydroxyphenols or catechols), and siloxane groups (Si—O).

Further, P represents an organic group, such as an alkyl, aryl, or heteroaryl group, including substituted alkyl, aryl, and hetero aryl groups, fullerene or derivative thereof. P groups with electron-transporting properties are preferred, and such electron-transporting properties typically arise in functionalized π-conjugated compounds.

Another group of molecular linkers are chosen such, that they are capable of modifying at least one surface of the semiconductors surface and linking this to the metallic nanoparticles. Linkers capable of forming self-assembled monolayers having electron-transporting properties are preferred. These linkers have a general formula

X—P—W wherein X is a functional group that interacts with or bonds to the surface of metallic nanoparticles and W to the semiconductor.

In this second group of molecular linkers, representative functional groups of X include thiol (e.g. SH or SR, where R is $C_1$-$C_6$ alkyl), amino (e.g. $NH_2$, NHR, or $NR_2$, where R is $C_1$-$C_6$ alkyl).

Further, representative functional groups of W include carboxylic acid groups (carboxylates, —$CO_2$-), phosphonic acid groups (phosphates, —$PO_3^{2-}$), sulfonic acid groups (sulfonates, —$SO_3^{2-}$), phenolic groups (dihydroxyphenols or catechols), and siloxane groups (Si—O). P is an organic group, such as an alkyl, aryl, or heteroaryl group, including substituted alkyl, aryl, and hetero aryl groups, fullerene or derivative thereof. P groups with electron-transporting properties are preferred, and such electron-transporting properties typically arise in functionalized π-conjugated compounds.

A third group of molecular linkers are chosen such, that they are capable of modifying at least one surface of the metallic surface of a substrate or a back contact and linking this to the surface of the semiconductor. Again, linkers capable of forming self-assembled monolayers having electron-transporting properties are preferred. These linkers also have the general formula

X—P—W wherein X is a functional group that interacts with or bonds to the surface of a metallic substrate or a back contact and W to the semiconductor.

In this third group, representative functional groups of X include thiol (e.g. SH or SR, where R is $C_1$-$C_6$ alkyl), amino (e.g. $NH_2$, NHR, or $NR_2$, where R is $C_1$-$C_6$ alkyl). Representative functional groups of W include carboxylic acid groups (carboxylates, —$CO_2^-$), phosphonic acid groups (phosphates, —$PO_3^2$), sulfonic acid groups (sulfonates, —$SO_3^{2-}$), phenolic groups (dihydroxyphenols or catechols), and siloxane groups (Si—O).

Further, P is an organic group, such as an alkyl, aryl, or heteroaryl group, including substituted alkyl, aryl, and hetero aryl groups, fullerene or derivative thereof. P groups with electron-transporting properties are preferred, and such electron-transporting properties typically arise in functionalized π-conjugated compounds.

In practice, one or more linkers belonging to one or more of the above first, second and third groups is/are used. Thus, the first, second and third linker can be the same or different.

According to a further embodiment of said second aspect, freely combinable with any of the above embodiments, the molecular linker is chosen from aromatic derivatives or short carbon chain (up to $C_6$) organic compounds and derivatives having at least one functional group for coordination to semiconductors and at least one group for coordination to the metal nanoparticles. Said groups are chosen from carboxylic acid groups (carboxylates), phosphonic acid groups (phosphates), sulfonic acid groups (sulfonates), phenolic groups (dihydroxyphenols or catechols), and siloxane groups. Representative organic compounds for use in the layer include carboxylic acids, phosphonates, sulfonates, phenols, thiols, and catechols.

According to a preferred embodiment of said second aspect, freely combinable with any of the above embodiments, the molecular linker is chosen from 4-aminobenzoic acid (pABA), 4-mercaptobenzoic acid, 3-aminobenzoic acid, 3-mercaptobenzoic acid, 4-forylbenzoic acid (pFBA), (4-aminobenzyl)phosphonic acid, 2-aminobenzoic acid, 2-mercaptobenzoic acid, terephthalic acid, 4'-amino-[1,1'-biphenyl]-4-carboxylic acid, naphthalene derivatives and polyaromatic derivatives.

Examples of molecular linkers are given in Table 1 above.

A third aspect relates to building elements comprising a plasmonic solar cell according to the first aspect or any one of the embodiments thereof, or a plasmonic solar cell produced according to a method according to said second aspect and any embodiments thereof.

According to an embodiment of said third aspect, said building element is chosen from a window, a roof element, a wall element, or other structural or functional building element.

SHORT DESCRIPTION OF THE DRAWINGS

Different aspects and embodiments of the invention will be described in closer detail below, in the description and examples, with reference to the drawings in which:

FIG. 1 schematically shows a conceptual design of an embodiment of a plasmonic solar cell delimited by a transparent conductive surface (A) and a back contact or counter electrode (B) according to an embodiment or the invention.

Figure 2:
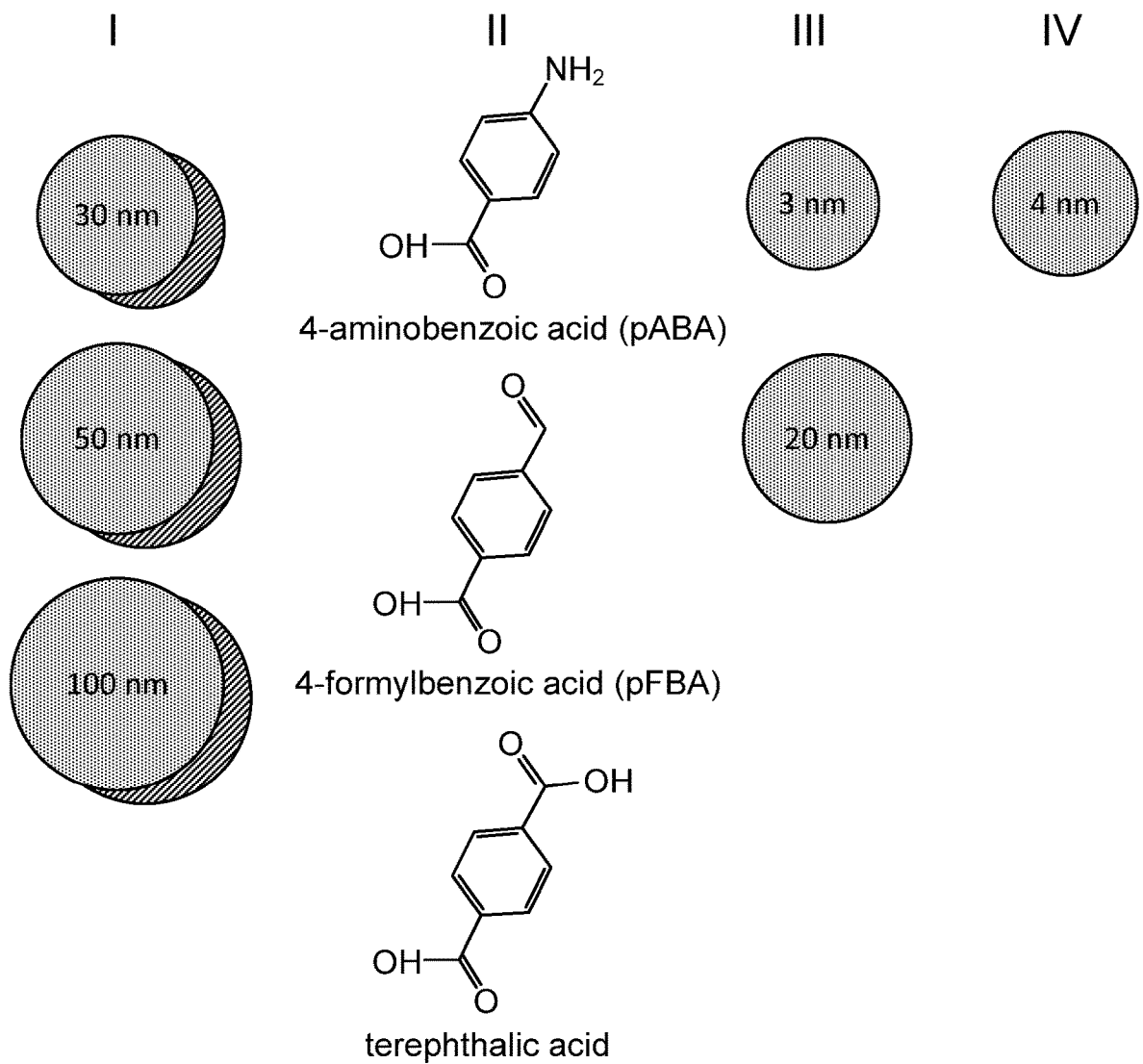

FIG. 2 schematically shows preferred examples of the basic units for the self-assembly layer-by-layer of a thin solar cell, i.e. metal nanoparticles (I), molecular linkers (II), n-type semiconductor (III) and p-type semiconductor (IV), according to an embodiment of the invention. The stabilization of the metal nanoparticles is indicated by the hatched area adjacent to the 30 nm, 50 nm and 100 nm examples of nanoparticles.

Figure 3:
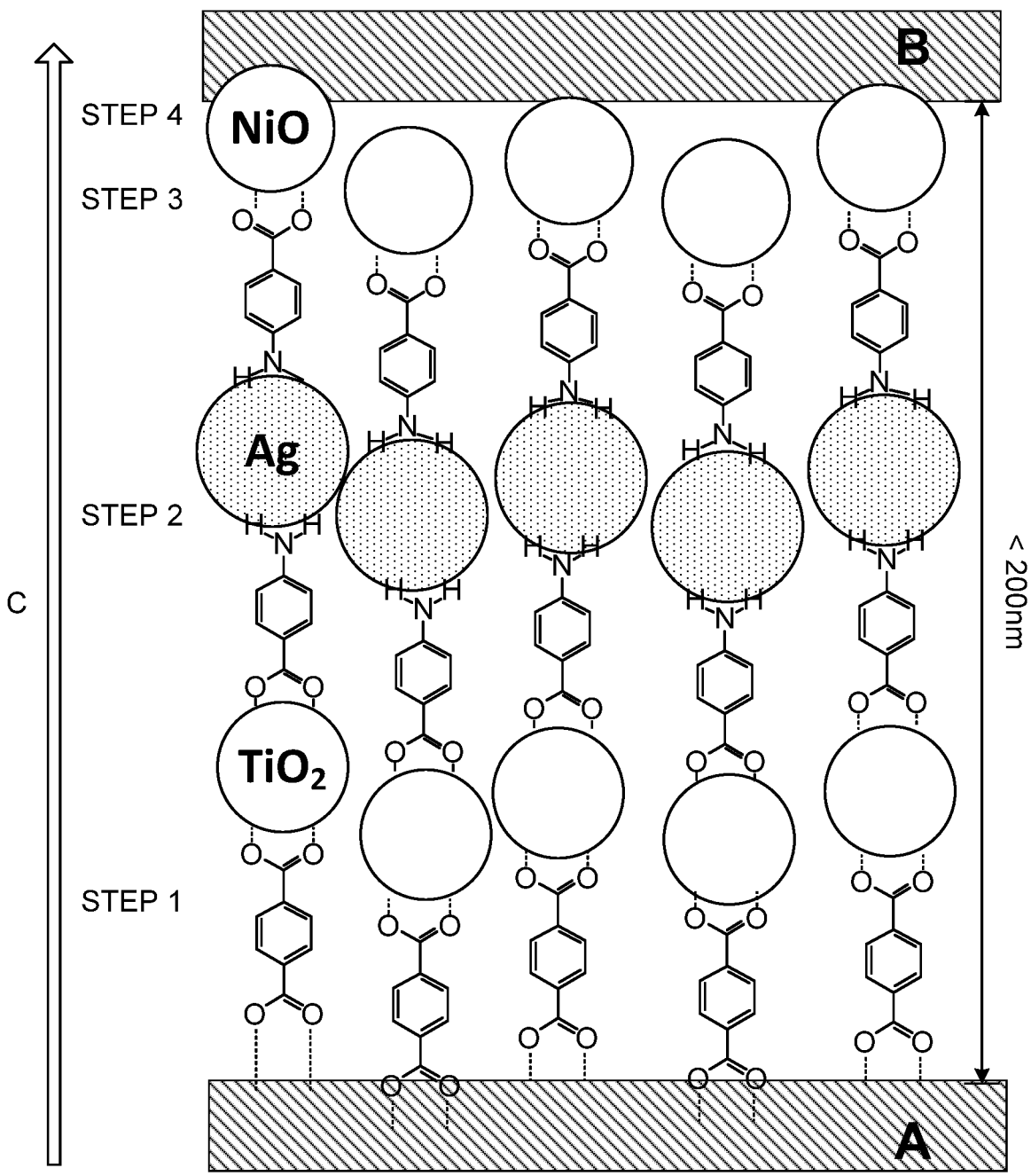

FIG. 3 illustrates the self-assembly layer-by-layer thin-solar cell architecture according to an embodiment of the invention.

Figure 4:
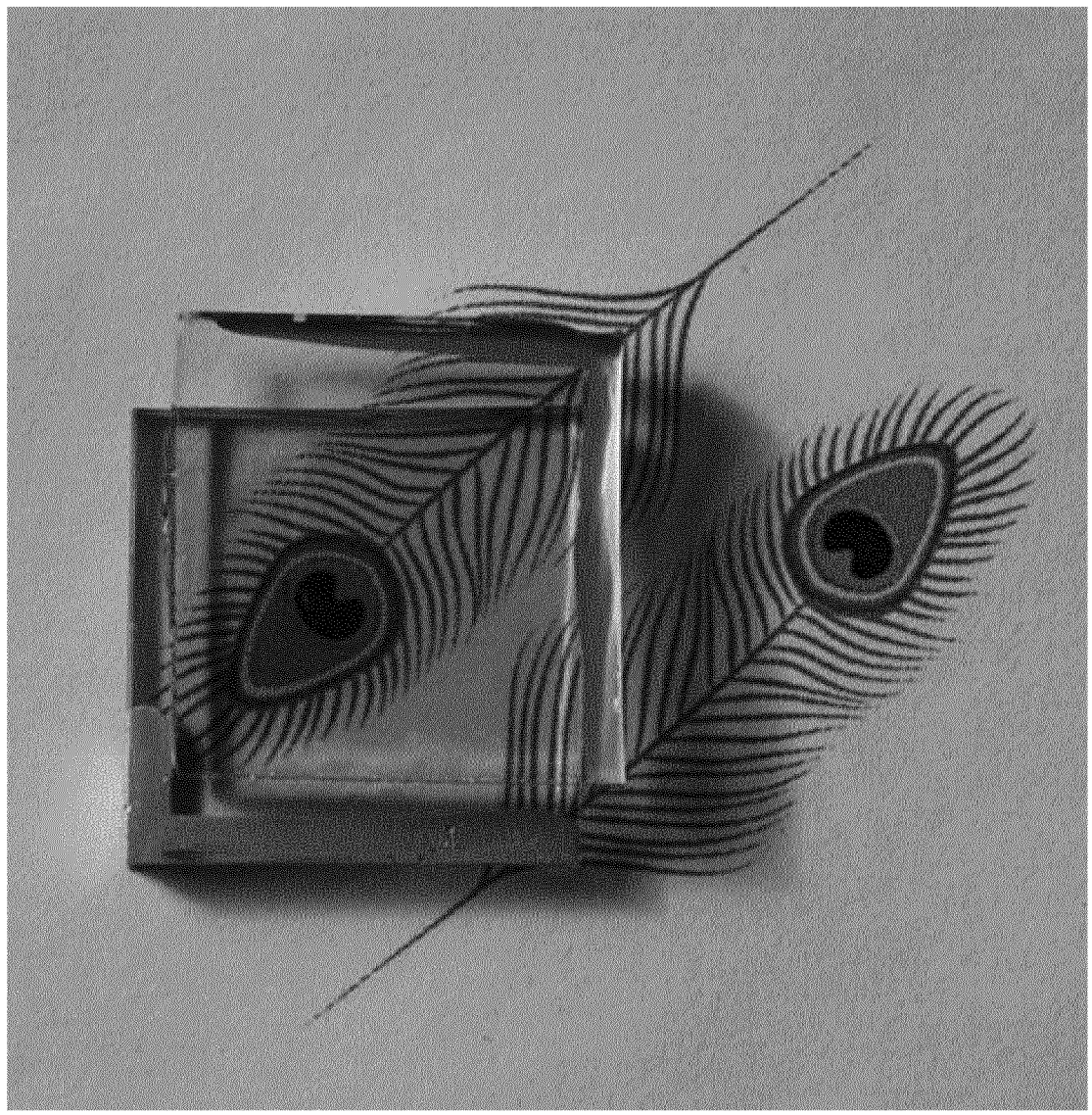

FIG. 4 is a photograph of a building element in the form of a solar cell according to the invention. It is placed over a schematic drawing of a peacock feather. The black-and-white reproduction shows the excellent transparency of the solar cell, as there is no blurring of the drawing. The color original showed that there was no distortion of the colors of the feather.

FIGS. 5A through F show different architectures denoted "type 1a" through "type 6" also presented in Table 2, and in the subsequent part of the description.

DESCRIPTION

Before the present invention is described, it is to be understood that the terminology employed herein is used for the purpose of describing particular embodiments only and is not intended to be limiting, since the scope of the present invention will be limited only by the appended claims and equivalents thereof.

Definitions

It must be noted that, as used in this specification and the appended claims, the singular forms "a," "an," and "the" include plural referents unless the context clearly dictates otherwise.

The term "about" as for example in "about 30 nm" is intended to mean "approximately 30 nm" and thus to encompass the interval of 29.6 to 30.5 nm in accordance to conventional rounding rules.

The term "transparent" is used here in its broadest sense, meaning the quality an object or substance has when you can see through it, or when it doesn't significantly influence the perception of the underlying material. Different degrees of transparency are required depending on the intended use of the solar cells disclosed herein. A high degree of transparency is required when the solar cells are incorporated on window glass, and a lower degree of transparency when incorporated on other building materials.

The term "modify" as in "modifying at least one surface of a substrate" refers to the act of deliberately altering the chemical properties of a surface in order to influence and facilitate the binding between the components in a solar cell according to the present invention. The medication can comprise alterations to the surface itself, or the binding of functional groups thereto.

The term "n-type semiconductors" refers to semiconductor materials in which electrons are the majority carriers and holes are the minority carriers. Examples of suitable n-type semiconductor materials include $TiO_2$, ZnO, $SnO_2$, $SrTiO_3$ and combinations thereof.

The term "p-type semiconductors" refers to semiconductor materials in which holes are the majority carriers, or positively charged carriers, and electrons are the minority carriers. Examples of suitable p-type semiconductor materials include NiO, $CuXO_2$, wherein X=Al, Cr, Ga, Fe, and combinations thereof.

The term "self-assembly" refers to the spontaneous assembly of precursor molecules to form nanostructured objects, and includes the option of asserting entropic control and/or chemical control over the self-assembly process in order to optimize the properties of the resulting material.

By supramolecular architectures with plasmonic nanoparticles it is understood a chemical system made up of a discrete number of assembled molecular subunits or components connected via strong covalent bonding. In the present case the subunits are preferably metallic nanoparticles of group 11, more preferably Al, Cu, Au, or Ag nanoparticles, n-type semiconductor nanoparticles (e.g. $TiO_2$, ZnO, $SnO_2$, $SrTiO_3$) or p-type semiconductor nanoparticles (e.g. NiO, $CuXO_2$, wherein X=Al, Cr, Ga, or Fe), interconnected via a molecular linker.

By conductive transparent substrate it is understood a transparent material with a conductive layer on one of the sides. Preferred examples are indium tin oxide (ITO) or fluorinated tin oxide (FTO).

Similarly, a conductive polymer substrate is a polymer with a conductive layer on one side, or a substrate made of a conductive polymeric material, either an intrinsically conducting polymer, or for example a substrate made of a conductive thermoplastic composite material.

Detailed Description

According to a first aspect, the present disclosure makes available a solar cell comprising
a layer of an n-type semiconductor;
a layer of metal nanoparticles selected from the group consisting of copper, gold, silver or aluminium; and
a layer of a p-type semiconductor;
the above layers sandwiched between a substrate and a back contact; wherein the substrate, n-type semiconductor, metal nanoparticles, p-type semiconductor and back contact respectively are linked by covalent bonds by means of one or more molecular linker or linkers.

The basic principle of an ultra thin plasmonic solar cell is illustrated in FIG. 1. This cell is based on the localized surface plasmon (LSP) resonance of a silver (Ag) nanoparticle, used as the light absorber. This is covalently linked to $TiO_2$ (an electron acceptor) on the one side, and NiO (a hole acceptor) on the other side, by means of 4-aminobenzoic acid (pABA) as molecular linker. In this example, the cell is delimited by a conductive transparent substrate (A) on one side, for example a glass substrate with a conductive layer on one side. Preferable conductive layers can comprise or consist substantially of indium tin oxide (ITO) or fluorinated tin oxide (FTO). On the other side is a back contact or counter electrode (B).

FIG. 2 illustrates some examples of basic units for the self-assembly layer-by-layer of a thin solar cell according to a preferred embodiment of the invention. In column I, silver nanoparticles capped with a stabilizing agent, for example betanin and/or betanin derivates, are shown. These can have an average particle size of for example 30, 50 or 100 nm, or a range of sizes for example from 20 to 200 nm. Column II shows three examples of molecular linkers, 4-aminobenzoic acid (pABA), 4-formylbenzoic acid (pFBA), and terephtalic acid. In column III, two examples of electron acceptors are given, here $TiO_2$ nanoparticles having the average particle size 3 nm or 20 nm. Finally, in column IV, one example of a hole acceptor, here NiO is shown, illustrated as a 4 nm particle. NiO nanoparticles of different sizes can however be used, for example in the interval 3 to 30 nm.

One example of the architecture of a solar cell according to the embodiments disclosed herein is shown in FIG. 3. The "bottom" layer A is preferably a conductive transparent substrate, for example a glass substrate with a conductive layer on one side. Preferred conductive layers can comprise or consist substantially of indium tin oxide (ITO) or fluorinated tin oxide (FTO). The "top" layer B is the back contact or counter electrode, which in the case of a transparent solar cell, is also a conductive transparent substrate. The arrow C illustrates the assembly of the layers in four steps:

Step 1: A conductive transparent substrate is modified with a molecular linker, and coated with a monolayer of $TiO_2$ nanoparticles which link covalently to the reactive groups of the molecular linkers.

Step 2: Metal nanoparticles modified with the same or another linker are subsequently grafted, resulting in the formation of a monolayer of metal nanoparticles.

Step 3: The structure is submersed in a solution of NiO nanoparticles to connect the system to the p-type semiconductor.

Step 4: The counter electrode or back contact is formed, e.g. evaporated on top of the NiO layer.

The method and the corresponding plasmonic solar cell can also be constructed in the reverse order, i.e. starting from a conductive substrate forming the cathode, subsequently forming a layer of p-type semiconductors on the cathode, then adding metal nanoparticles modified with the same or another linker are subsequently grafted, resulting in the formation of a monolayer of metal nanoparticles, adding the n-type semiconductors, and finally a transparent conductive surface.

In performing these steps, the loading of each component can be finely tuned by changing the molar ratio of the linkers. The self-assembly can also be controlled by regulating the temperature, often referred to as entropic control, and by controlling the pH and solvent used.

In addition to the architecture shown in FIG. 3 (type 1), different configurations can be used, for examples those presented in Table 2:

TABLE 2

Examples of solar cell architectures

| | Type 1a | Type 2 | Type 3 | Type 4 | Type 5 | Type 6 |
|---|---|---|---|---|---|---|
| 9 | TCO | TCO | TCO | TCO | TCO | TCP |
| 8 | Linker | Linker | Linker | Linker | Linker | Linker |
| 7 | NiO | NiO | NiO | NiO | NiO | NiO |
| 6 | Linker | Linker | Linker | Linker | Linker | Linker |
| 5 | Ag NPs | Ag NPs | Ag NPs | Ag NPs | Ag NPs | Ag NPs |
| 4 | Linker | Linker | Linker | Linker | Linker | Linker |
| 3 | $TiO_2$ | $TiO_2$ | $TiO_2$ | $TiO_2$ | $TiO_2$ | $TiO_2$ |
| 2 | Linker | Linker | Linker | Linker | TCO | TCP |
| 1 | TCO | TCO | TCO | TCO | | |

In the table above, the following abbreviations are used: NPs=nanoparticles, TCO=transparent conductive oxide, TCP=transparent conductive polymer.

Figure 5:
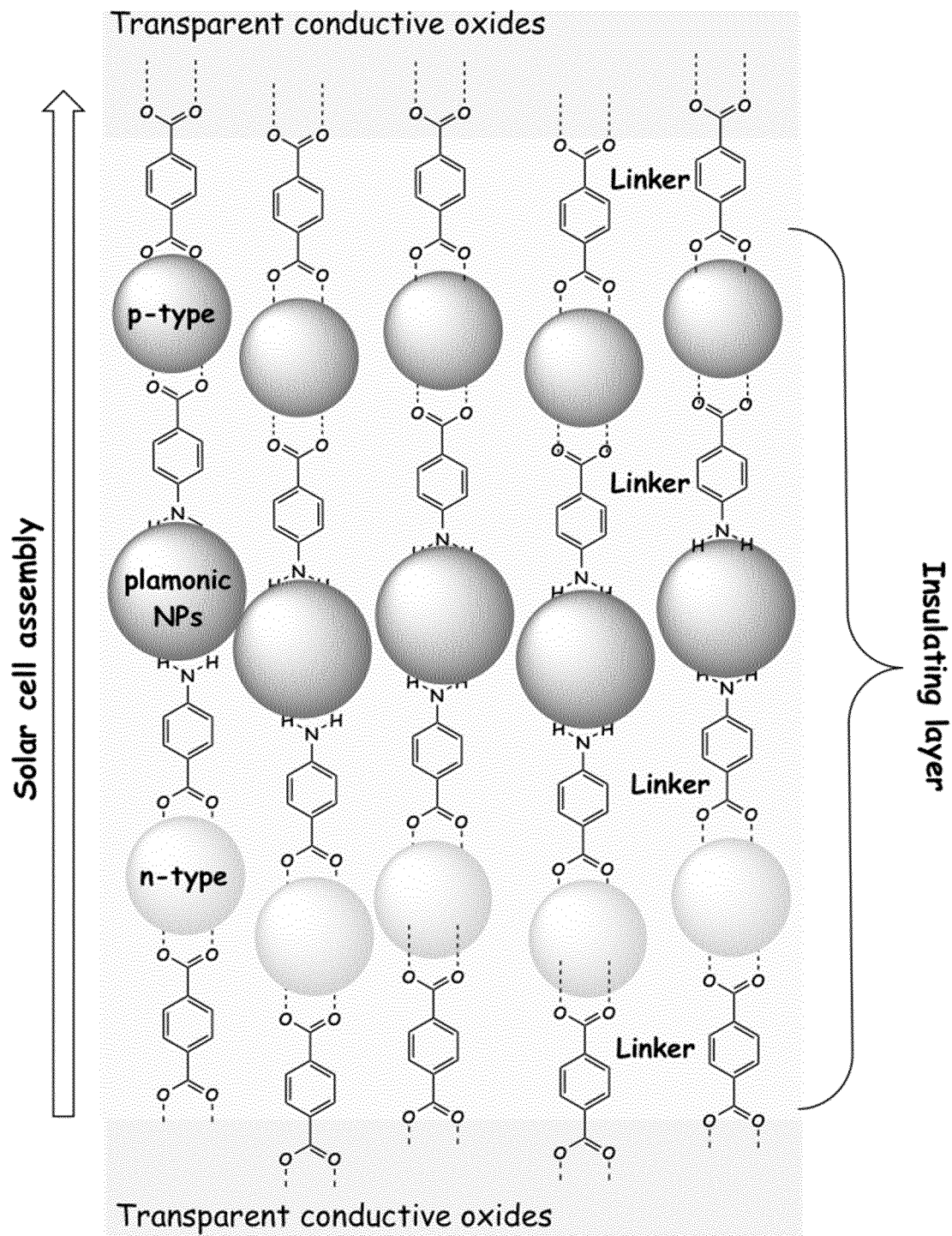
Figure 5:
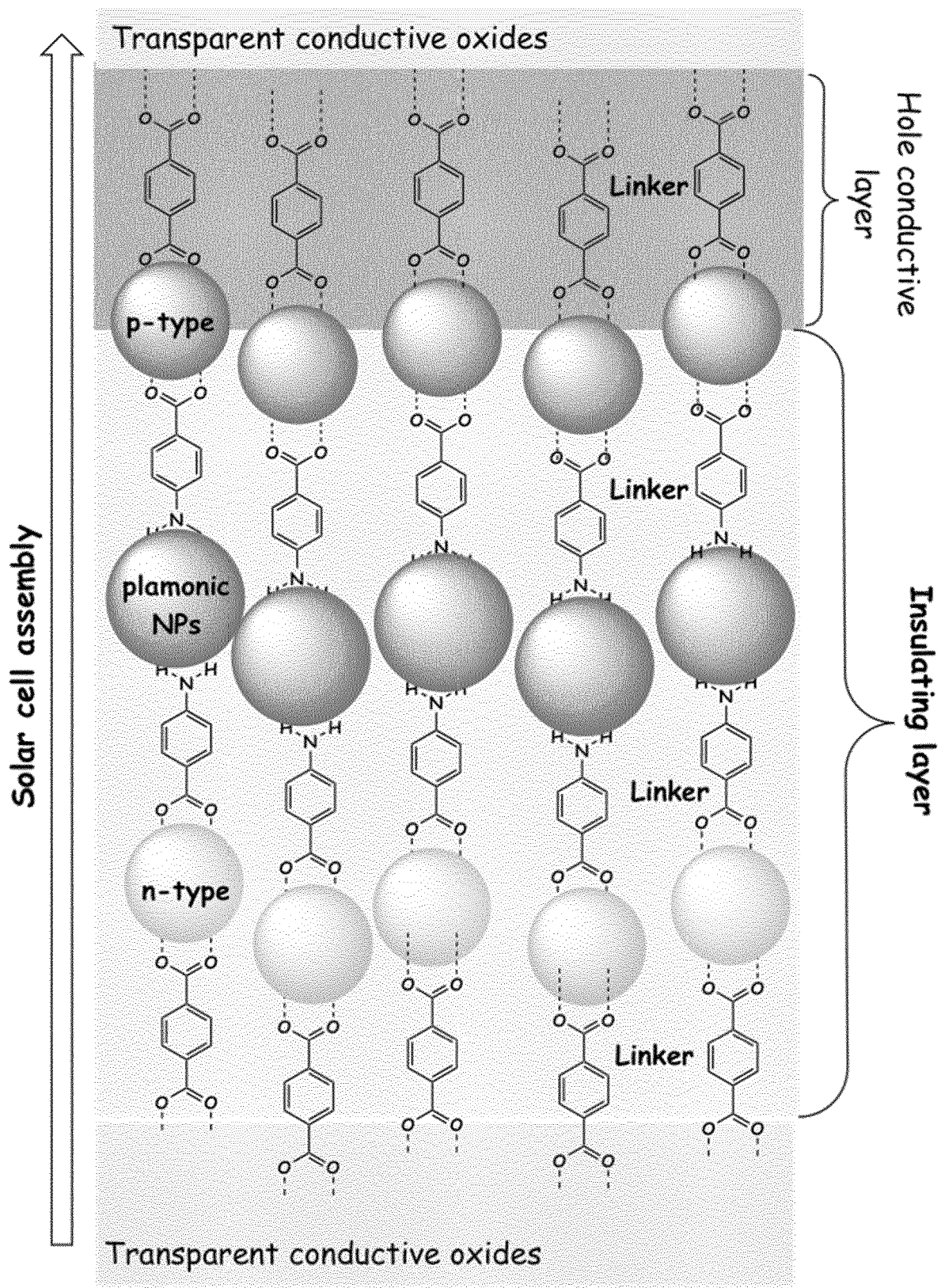
Figure 5:
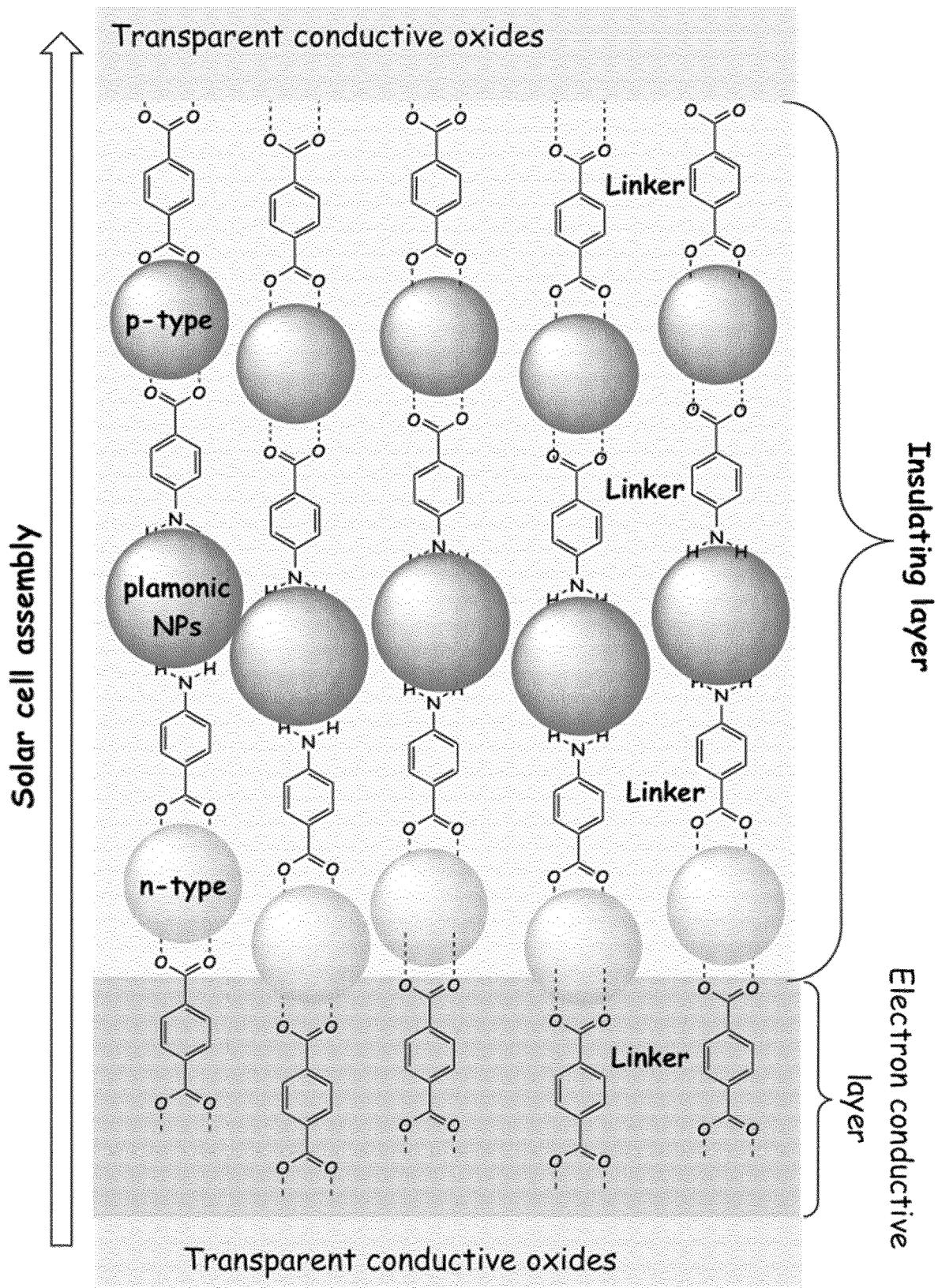
Figure 5:
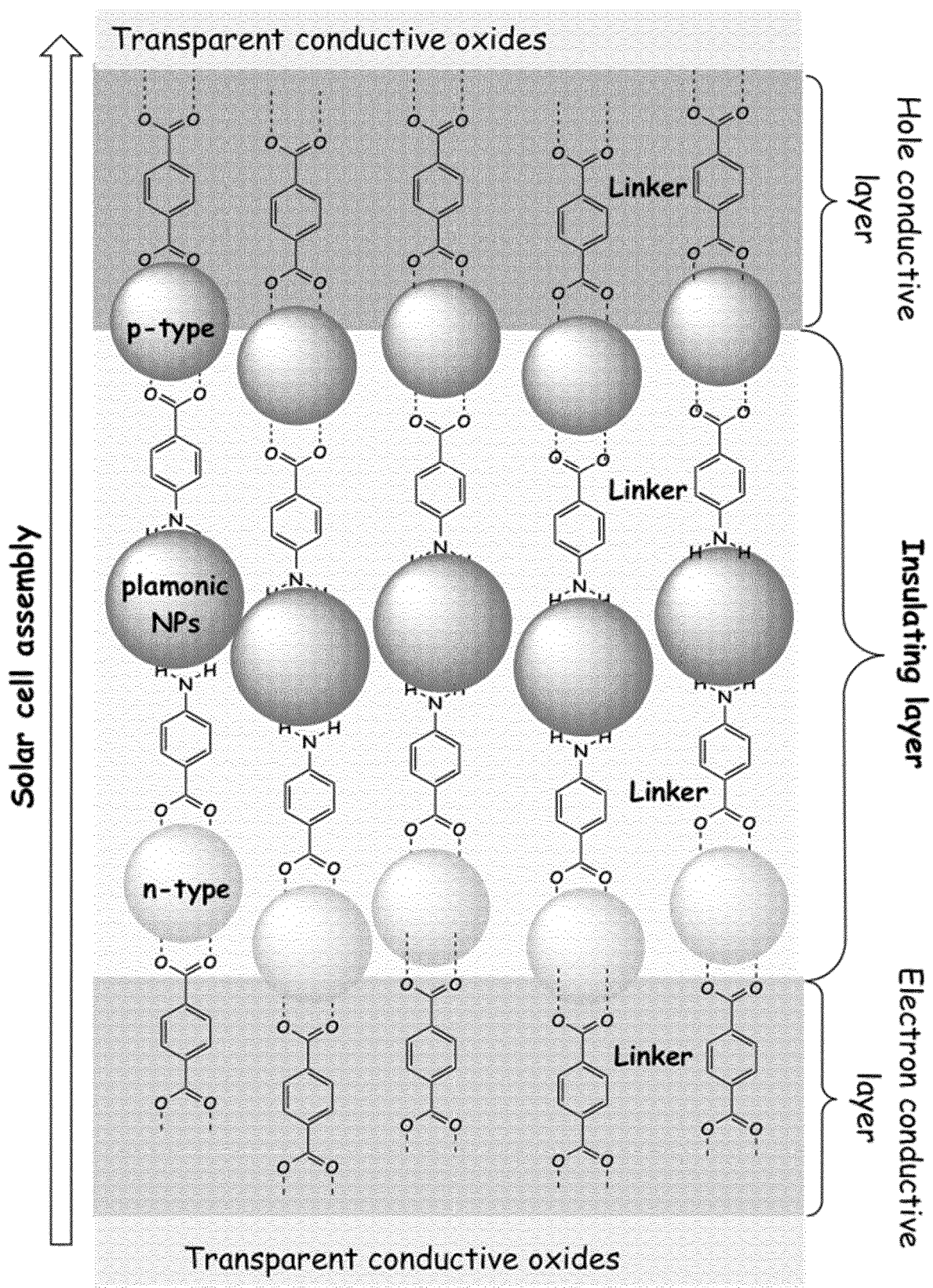
Figure 5:
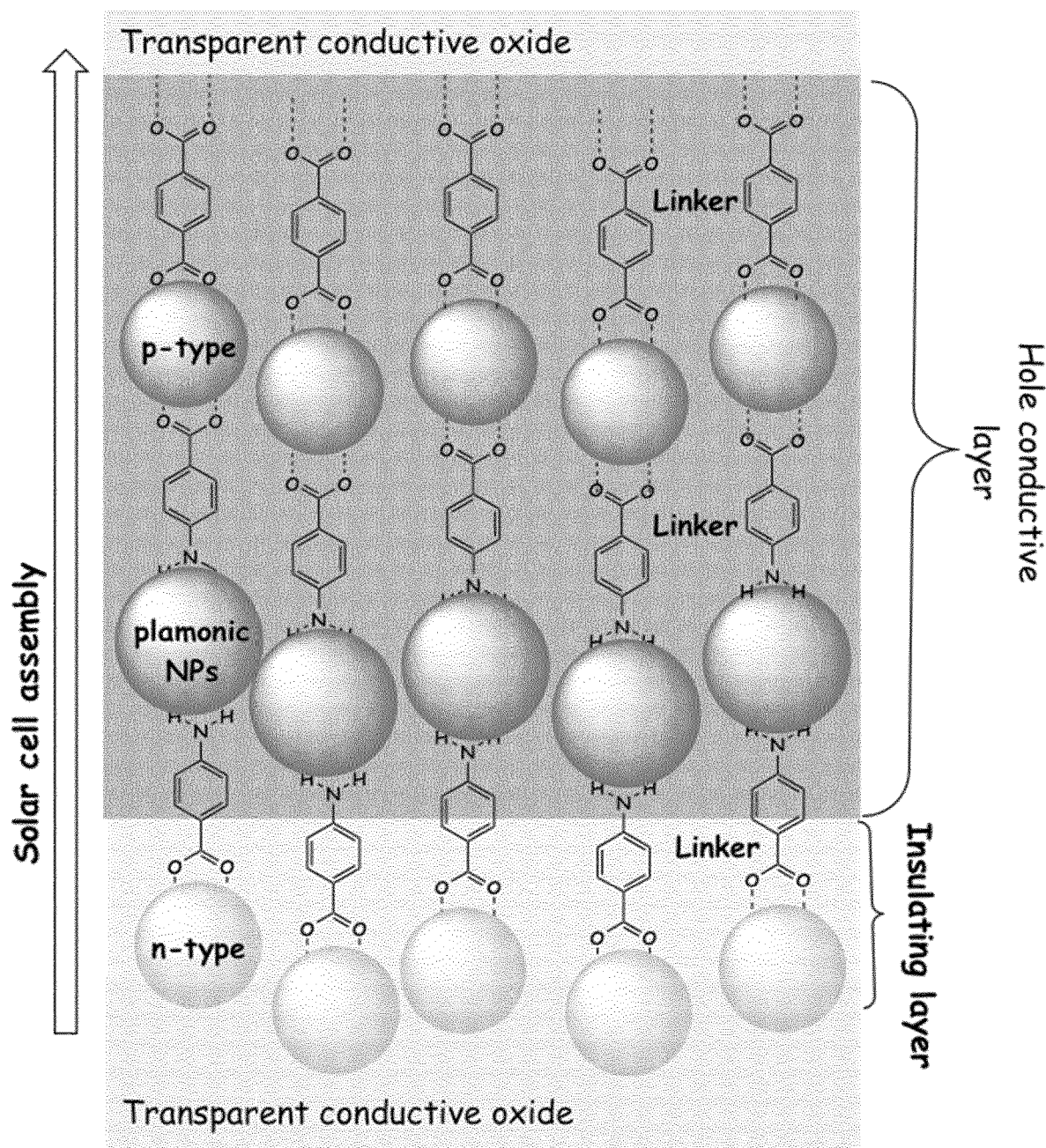
Figure 5:
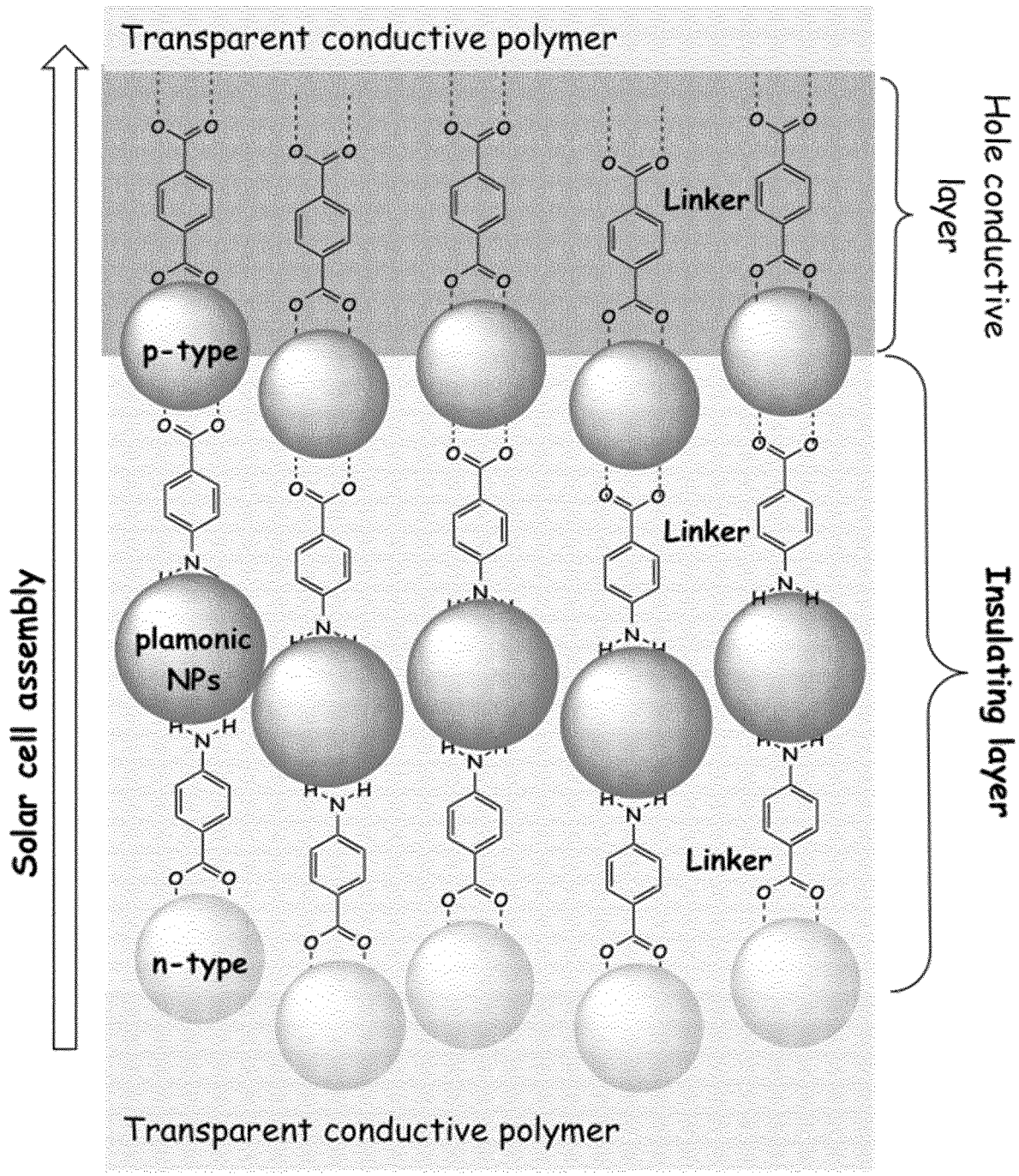

In the "type 1a" assembly, the layers 2 to 8 are embedded in insulating media, for example $Al_2O_3$, $SiO_2$ or amorphous $TiO_2$, as illustrated in FIG. 5 A, whereas in "type 2" a hole conductive layer is interposed between the p-type semiconductor layer and the transparent conductive oxides layer 9, as shown in FIG. 5 B. Only layers 2 to 7 are embedded in insulating media, for example $Al_2O_3$, $SiO_2$ or amorphous $TiO_2$.

In a "type 3" assembly, as shown in FIG. 5 C, an electron conductive layer is interposed between the transparent conductive oxides of layer 1, and the n-type semiconductor layer 3, and the layers 3 to 8 are embedded in insulating media, for example $Al_2O_3$, $SiO_2$ or amorphous $TiO_2$. In an assembly according to "type 4" as shown in FIG. 5 D, an electron conductive layer is present adjacent to layer 1, and a hole conducting layer adjacent to layer 9, and layers 3 to 7 are embedded in insulating media, for example $Al_2O_3$, $SiO_2$ or amorphous $TiO_2$.

FIG. 5 E illustrates an assembly according to "type 5" where the n-type semiconductors are directly adjacent to the transparent conductive oxides of layer 1, and a hole conductive layer is arranged on top of the p-type semiconductors. The insulating media, for example $Al_2O_3$, $SiO_2$ or amorphous $TiO_2$, encompasses layers 3 to 7. In an assembly as exemplified as "type 6" and schematically shown in FIG. 5 F, the n-type semiconductors are arranged directly on a transparent conductive polymer forming layer 1, and a hole conductive layer is arranged on the p-type semiconductors, adjacent to a top layer 9 also consisting of a transparent conductive polymer.

According to a preferred embodiment of said first aspect, the layer comprising an n-type semiconductor layer has a thickness of about 30 nm or less, preferably 20 nm or less, more preferably 18 nm or less, e.g. 16 nm, 14 nm, 12 nm or less.

According to another preferred embodiment of said first aspect, freely combinable with the above, the layer comprising a p-type semiconductor layer has a thickness of about 30 nm or less, preferably 20 nm or less, more preferably 18 nm or less, e.g. 16 nm, 14 nm, 12 nm or less.

According to another embodiment of said first aspect, freely combinable with any of the above embodiments, the conductive transparent substrate is chosen from indium tin oxide, fluorinated tin oxide and conductive polymers.

According to yet another embodiment, freely combinable with any of the above embodiments, the n-type semiconductor is chosen from $TiO_2$, ZnO, $SnO_2$, $SrTiO_3$, or a combination thereof, and preferably consists substantially of $TiO_2$.

According to preferred embodiment, freely combinable with any of the above embodiments, the metal nanoparticles are stabilized with a stabilizing agent, for example betanin or a betanin derivative. Betanin (betanidin-5-O-β-glucoside, IUPAC name (2S)-1-[(2E)-2-[(2,3)-2,6-dicarboxy-2,3-dihydro-1H-pyridin-4-ylidene]ethylidene]-6-hydroxy-5-[(2S,3R,4S,5S,6R)-3,4,5-trihydroxy-6-(hydroxymethypoxan-2-yl]oxy-2,3-dihydroindo1-1-ium-2-carboxylate) can be obtained from beet root, and is the most common betacyanin in the plant kingdom. In addition to its uses as a food colorant, betanin can act as a stabilizer against oxidation.

According to another preferred embodiment, also freely combinable with any of the above embodiments, the metal nanoparticles are silver nanoparticles.

In one embodiment, the layer of silver nanoparticles has a thickness in the range of about 20 to about 250 nm. This has the advantage of the layer absorbing incoming light of the entire solar spectrum.

According to yet another embodiment, freely combinable with any of the above embodiments, the p-type semiconductor is chosen from NiO, $CuXO_2$, wherein X=Al, Cr, Ga, Fe, and combinations thereof, and preferably consists substantially of NiO.

According to a further embodiment, freely combinable with any of the above embodiments, the molecular linker is chosen from aromatic derivatives or short carbon chain (up to $C_6$) organic compounds and derivatives having at least one functional group for coordination to semiconductors and at least one amine or thiol group for coordination to the metal nanoparticles. Said group or groups are chosen from carboxylic acid groups (carboxylates), phosphonic acid groups (phosphates), sulfonic acid groups (sulfonates), phenolic groups (dihydroxyphenols or catechols), and siloxane groups. Representative organic compounds for use in the layer include carboxylic acids, phosphonates, sulfonates, phenols, thiols, and catechols.

One group of molecular linkers are chosen such, that they are capable of modifying at least one surface of a substrate or a back contact, for example a metal oxide surface, and linking this to a surface of the semiconductors. Linkers capable of forming self-assembled monolayers having electron-transporting properties are preferred. These linkers have a general formula

Y—P—Z wherein Y and Z are functional groups that interact with or bond to the surface of the substrate or the back contact linking or connecting it to the semiconductor.

In this first group of molecular linkers, representative functional groups of Y and Z include for example carboxylic acid groups (carboxylates, $—CO_2^-$), phosphonic acid groups (phosphates, $—PO_3^{2-}$), sulfonic acid groups (sulfonates, $—SO_3^{2-}$), phenolic groups (dihydroxyphenols or catechols), and siloxane groups (Si—O).

Further, P represents an organic group, such as an alkyl, aryl, or heteroaryl group, including substituted alkyl, aryl, and hetero aryl groups, fullerene or derivative thereof. P groups with electron-transporting properties are preferred, and such electron-transporting properties typically arise in functionalized π-conjugated compounds.

Another group of molecular linkers are chosen such, that they are capable of modifying at least one surface of a surface of a semiconductor and linking this to the metallic nanoparticles. Linkers capable of forming self-assembled monolayers having electron-transporting properties are preferred. These linkers have a general formula

X—P—W wherein X is a functional group that interacts with or bonds to the surface of metallic nanoparticles and W to the semiconductor.

In this second group of molecular linkers, representative functional groups of X include thiol (e.g. SH or SR, where R is $C_1$-$C_6$ alkyl), amino (e.g. $NH_2$, NHR, or $NR_2$, where R is $C_1$-$C_6$ alkyl).

Further, representative functional groups of W include carboxylic acid groups (carboxylates, $—CO_2$), phosphonic acid groups (phosphates, $—PO_3^{2-}$), sulfonic acid groups (sulfonates, $—SO_3^2$), phenolic groups (dihydroxyphenols or catechols), and siloxane groups (Si—O). P is an organic group, such as an alkyl, aryl, or heteroaryl group, including substituted alkyl, aryl, and hetero aryl groups, fullerene or derivative thereof. P groups with electron-transporting properties are preferred, and such electron-transporting properties typically arise in functionalized π-conjugated compounds.

A third group of molecular linkers are chosen such, that they are capable of modifying at least one surface of the metallic surface of a substrate or a back contact and linking this to the surface of the semiconductor. Again, linkers capable of forming self-assembled monolayers having electron-transporting properties are preferred. These linkers also have the general formula

X—P—W wherein X is a functional group that interacts with or bonds to the surface of a metallic substrate or a back contact and W to the semiconductor.

In this third group, representative functional groups of X include thiol (e.g. SH or SR, where R is $C_1$-$C_6$ alkyl), amino (e.g. $NH_2$, NHR, or $NR_2$, where R is $C_1$-$C_6$ alkyl). Representative functional groups of W include carboxylic acid groups (carboxylates, $—CO_2^-$), phosphonic acid groups (phosphates, $—PO_3^{2-}$), sulfonic acid groups (sulfonates, $SO_3^{2-}$), phenolic groups (dihydroxyphenols or catechols), and siloxane groups (Si—O).

Further, P is an organic group, such as an alkyl, aryl, or heteroaryl group, including substituted alkyl, aryl, and hetero aryl groups, fullerene or derivative thereof. P groups with electron-transporting properties are preferred, and such electron-transporting properties typically arise in functionalized π-conjugated compounds.

In practice, one or more linkers belonging to one or more of the above first, second and third groups is/are used. Thus, the first, second and third linker can be the same or different.

Preferably the molecular linker is chosen from 4-aminobenzoic acid (pABA), 4-mercaptobenzoic acid, 3-aminobenzoic acid, 3-mercaptobenzoic acid, 4-forylbenzoic acid (pFBA), (4-aminobenzyl)phosphonic acid, 2-aminobenzoic acid, 2-mercaptobenzoic acid, terephthalic acid, 4'-amino-[1,1'-biphenyl]-4-carboxylic acid, naphthalene derivatives and polyaromatic derivatives, as shown in Table 1 above.

Another aspect relates to a method for producing a solar cell, preferably a plasmonic ultra thin solar cell, said method comprising the steps of:
i) modifying a conductive substrate with a monolayer of an organic molecular linker by submersing it in an solution with the linker, and coating it with a layer of a semiconductor which is either n-type or p-type,
ii) modifying metal nanoparticles with a molecular linker,
iii) grafting the modified metal nanoparticles from step ii) to the modified conductive substrate from step i),
iv) submersing the substrate from step iii) in a solution of a semiconductor of p-type when the semiconductor in step i) is n-type, and n-type, when the semiconductor in step i) is p-type,
v) evaporating a back contact conductive layer on top of the semiconductor of step iv) with a layer thickness preferably of about 50 to 100 nm, and optionally applying the layers formed in steps i)-v) to a second substrate.

This method is schematically illustrated in FIG. 3, where however steps ii) and iii) are presented as one.

According to a preferred embodiment of said second aspect, the layer comprising an n-type semiconductor layer has a thickness of about 30 nm or less, preferably 20 nm or less, more preferably 18 nm or less, e.g. 16 nm, 14 nm, 12 nm or less.

According to another preferred embodiment of said second aspect, freely combinable with the above, the layer comprising a p-type semiconductor layer has a thickness of about 30 nm or less, preferably 20 nm or less, more preferably 18 nm or less, e.g. 16 nm, 14 nm, 12 nm or less.

According to yet another embodiment of said second aspect, freely combinable with any of the above, the conductive transparent substrate is chosen from indium tin oxide, fluorinated tin oxide and conductive polymers.

According to yet another embodiment of said second aspect, freely combinable with any of the above, the n-type semiconductor is chosen from $TiO_2$, ZnO, $SnO_2$, $SrTiO_3$, or a combination thereof, and preferably consists substantially of $TiO_2$.

According to a further embodiment of said second aspect, freely combinable with any of the above, the metal nanoparticles are silver nanoparticles. Preferably the layer of silver nanoparticles has a thickness in the range of about 20 to about 250 nm. This has the advantage of the layer absorbing incoming light of the entire solar spectrum.

According to a further embodiment of said second aspect, freely combinable with any of the above, the metal nanoparticles are stabilized with a stabilizing agent, for example betanin or a betanin derivate.

According to yet another embodiment of said second aspect, freely combinable with any of the above, wherein the p-type semiconductor is chosen from NiO, $CuXO_2$, wherein X=Al, Cr, Ga, Fe, and combinations thereof, and preferably consists substantially of NiO.

According to a further embodiment of said second aspect, freely combinable with any of the above embodiments, the molecular linker is an organic group, such as an alkyl, aryl, or heteroaryl group, including substituted alkyl, aryl, and hetero aryl groups, fullerene or derivative thereof, having at least one functional group, for coordination to semiconductors and at least one group for coordination to the metal nanoparticles. Said groups are chosen from carboxylic acid groups (carboxylates), phosphonic acid groups (phosphates), sulfonic acid groups (sulfonates), phenolic groups (dihydroxyphenols or catechols), and siloxane groups for coordination to oxides and thiol (e.g. SH or SR, where R is $C_1$-$C_6$ alkyl), amino (e.g. $NH_2$, NHR, or $NR_2$, where R is $C_1$-$C_6$ alkyl) to coordinate to metal. Representative organic compounds for use in the layer include carboxylic acids, phosphonates, sulfonates, phenols, thiols, and catechols.

One group of molecular linkers are chosen such, that they are capable of modifying at least one surface of a substrate or back contact, for example a metal oxide surface, and linking this to a surface of the semiconductor. Linkers capable of forming self-assembled monolayers having electron-transporting properties are preferred. These linkers have a general formula

Y—P—Z wherein Y and Z are functional groups that interact with or bond to the surface of the substrate or back contact linking or connecting it to the semiconductor.

In this first group of molecular linkers, representative functional groups of Y and Z include for example carboxylic acid groups (carboxylates, —$CO_2^-$), phosphonic acid groups (phosphates, —$PO_3^{2-}$), sulfonic acid groups (sulfonates, —$SO_3^{2-}$), phenolic groups (dihydroxyphenols or catechols), and siloxane groups (Si—O).

Further, P represents an organic group, such as an alkyl, aryl, or heteroaryl group, including substituted alkyl, aryl, and hetero aryl groups, fullerene or derivative thereof. P groups with electron-transporting properties are preferred, and such electron-transporting properties typically arise in functionalized π-conjugated compounds.

Another group of molecular linkers are chosen such, that they are capable of modifying at least one surface of a surface of a semiconductor and linking this to metallic nanoparticles. Linkers capable of forming self-assembled monolayers having electron-transporting properties are preferred. These linkers have a general formula

X—P—W wherein X is a functional group that interacts with or bonds to the surface of metallic nanoparticles and W to the semiconductor.

In this second group of molecular linkers, representative functional groups of X include thiol (e.g. SH or SR, where R is $C_1$-$C_6$ alkyl), amino (e.g. $NH_2$, NHR, or $NR_2$, where R is $C_1$-$C_6$ alkyl).

Further, representative functional groups of W include carboxylic acid groups (carboxylates, —$CO_2^-$), phosphonic acid groups (phosphates, —$PO_3^{2-}$), sulfonic acid groups (sulfonates, —$SO_3^{2-}$), phenolic groups (dihydroxyphenols or catechols), and siloxane groups (Si-0). P is an organic group, such as an alkyl, aryl, or heteroaryl group, including substituted alkyl, aryl, and hetero aryl groups, fullerene or derivative thereof. P groups with electron-transporting properties are preferred, and such electron-transporting properties typically arise in functionalized π-conjugated compounds.

A third group of molecular linkers are chosen such, that they are capable of modifying at least one surface of a substrate or back contact and linking this to a surface of the semiconductor. Again, linkers capable of forming self-assembled monolayers having electron-transporting properties are preferred. These linkers also have the general formula

X—P—W wherein X is a functional group that interacts with or bonds to the surface of metallic substrate or back contact and W to the semiconductor.

In this third group, representative functional groups of X include thiol (e.g. SH or SR, where R is $C_1$-$C_6$ alkyl), amino (e.g. $NH_2$, NHR, OR $NR_2$, where R is $C_1$-$C_6$ alkyl). Representative functional groups of W include carboxylic acid groups (carboxylates, $—CO_2^-$), phosphonic acid groups (phosphates, $—PO_3^{2-}$), sulfonic acid groups (sulfonates, $—SO_3^{2-}$), phenolic groups (dihydroxyphenols or catechols), and siloxane groups (Si—O).

Further, P is an organic group, such as an alkyl, aryl, or heteroaryl group, including substituted alkyl, aryl, and hetero aryl groups, fullerene or derivative thereof. P groups with electron-transporting properties are preferred, and such electron-transporting properties typically arise in functionalized π-conjugated compounds.

In practice, one or more linkers belonging to one or more of the above first, second and third groups is/are used. Thus, the first, second and third linker can be the same or different.

According to a preferred embodiment of said second aspect, freely combinable with any of the above embodiments, the molecular linker is chosen from 4-aminobenzoic acid (pABA), 4-mercaptobenzoic acid, 3-aminobenzoic acid, 3-mercaptobenzoic acid, 4-forylbenzoic acid (pFBA), (4-aminobenzyl)phosphonic acid, 2-aminobenzoic acid, 2-mercaptobenzoic acid, terephthalic acid, 4'-amino-[1,1'-biphenyl]-4-carboxylic acid, naphthalene derivatives and polyaromatic derivatives. For reference, see Table 1 above.

The success of the solar cell according to the invention is intimately related to the molecular linker used. The requirements for the molecular linker are that it should provide an excellent electronic coupling because of its good π-conjugated properties, rigidity and planarity. Moreover, it should have functionalities that allow covalent connectivity between electron donor and acceptor parts via self-assembly. Covalent connectivity between electron donor and acceptor parts with molecular linker will be ensured by using molecules with selective reactive groups to each component, namely carboxylic or phosphonic acid (coordination to $TiO_2$, NiO and ITO), and amine or thiols (coordination to Ag NPs).

A third aspect relates to building elements comprising a solar cell according to any one of the embodiments of said first aspect, or solar cells produced according to the method of said second aspect and any embodiments thereof.

According to an embodiment of said third aspect, said building element is chosen from a window, a roof element, a wall element, or other structural or functional element.

Preferably, the metallic nanoparticles are silver nanoparticles. Due to the increasing usage of silver nanoparticles in consumer products, there is a large international effort to substantiate silver nanoparticle safety. Colloidal silver has been consumed for decades for its perceived health benefits but detailed studies on its effect on the environment have just begun. Initial studies have demonstrated that effects on cells and microbes are primarily due to a low level of silver ion release from the nanoparticle surface but all studies to date suggest that silver nanoparticle toxicity is much less than the equivalent mass loading of silver salts. An advantage of using silver nanoparticles would therefore be a reduced strain on the environment.

The method for producing an ultra thin plasmonic solar cell disclosed herein has many advantages. The method uses self-assembly layer-by-layer deposition in solution, preferably in aqueous media, at room temperature, or close to room temperature, or at a temperature less than 100° C.

The molecular linker has a dual function, namely covalently linking electron donor (Ag NPs) to electron acceptor ($TiO_2$) and improve the electronic coupling between both units, as confirmed by ultrafast transient absorption measurements, which revealed a fast raising component of about 800 fs related to the effective electron transfer from electron donor to electron acceptor. Moreover, evidence of hole stabilization mechanism related to the betanin moieties on Ag NPs has been observed.

A significant advantage is that a solar cell having a thickness of less than 200 nm can be achieved. This makes it possible to incorporate solar cells also in transparent and semitransparent surfaces. Another advantage is that a thin solar cell can be incorporated in other building elements without adding bulk or significantly change their appearance.

In particular, solar cells according to the aspects and embodiments put forward in the present disclosure provide the following advantages:

They can be manufactured via self-assembly layer-by-layer deposition, at room temperature or close to room temperature The manufacturing can take place in solution, preferably in an aqueous environment, thus minimizing the use of hazardous and/or environmentally questionable chemicals.

The components are covalently linked, allowing the method to be performed as self-assembly at room temperature, or close at room temperature, or at least at a temperature less than 100° C.

Silver (Ag) is used as the LSP light harvester, making it a safe, environmentally compatible and economical system.

It becomes practically possible to produce a solar cell with an active medium having a thickness less than 200 nm.

All components are UV resistant.

The reduced number of basic units allows high tunability. Tunability can be reached by modifying the identity and molar ratio of the organic linkers.

EXAMPLES

Example 1

Synthesis of Metal Nanoparticles

Gold, silver and copper metal nanoparticles were synthesized starting from the respective metal precursor, for example but not limited to $AgNO_3$, $CuSO_4$, $CuCl_2$, or $HAuCl_4$, a reducing agent, and a stabilizing agent. Examples of reducing agents include $NaBH_4$, $N_2H_4$, ascorbic acid, betanin, polyols for example ethylene glycol, di-ethylene glycol, triethylene glycol, tetraethylene glycol polyethylene glycol. Examples of stabilizing or growth-limiting agents include betanin, polyvinylpyrrolidone, polyvinyl acetate, polyols such as for example ethylene glycol, di-ethylene glycol, triethylene glycol, tetraethylene glycol polyethylene glycol. All reagents were purchased from Sigma-Aldrich/Merck and were of analytical quality.

The present inventors followed the protocol presented in Dong et al., 2015, incorporated herein by reference, changing selected parameters such as the concentration of components, solvents, reaction temperature, and reaction time in order to optimize the geometry of the nanoparticles and the size distribution.

Two bottom-up synthesis procedures were adopted to prepare Ag nanoparticles (NPs) stabilized with betanin and derivatives (Bts-Ag NPs). The Bts-Ag NPs are synthesized in an automated microfluidic reactor (Asia Syringe Pump, Syrris Ltd., Royston, UK) via alkaline hydrolysis of natural betanin. Optimization via a multi-objective genetic algorithm ensures that Ag NPs are homogeneous in size and narrow light absorption. For example Fernandes et al. obtained particles with sizes between 40-45 nm determined by dynamic light scattering (DLS, NanoS, Malvern Panalytical Ltd., Malvern, UK) and atomic force microscopy (AFM, Nanosurf AG, Liestal, Switzerland) and central absorption at 405 nm (DH-2000-BAL connected to a USB-4000 spectrometer, Ocean Optics Inc., Largo, Fla., USA).

As an alternative, Bts-Ag NPs are synthesized in a microwave synthesis reactor (Monowave 50, Anton Paar GmbH, Austria) via acid or alkaline hydrolysis of natural betanin extracted from beetroot. This procedure is very fast and produces Bts-Ag NPs in high yields with high degree of reproducibility. The nanoparticles are polydispersed ensuring a better matching with solar spectrum. The method results in particles with sizes between 20-200 nm as determined by dynamic light scattering (DLS, NanoS, Malvern Panalytical Ltd., Malvern, UK) and atomic force microscopy (AFM, Nanosurf AG, Liestal, Switzerland) and light absorption spanning from 350-720 nm (DH-2000-BAL connected to a USB-4000 spectrometer, Ocean Optics Inc., Largo, Fla., USA).

After synthesis, pH of the Ag nanoparticle suspension is adjusted to 4-5 and the particles are coated with pABA (Sigma-Aldrich), which anchors to Ag surface via the —$NH_2$.

The resulting silver, gold and copper nanoparticles are tested in the set-up disclosed below.

Example 2

Semiconductor Nanoparticles

NiO remains among the best p-type semiconductors, making it the preferred choice for a proof-of-concept device. NiO nanoparticles are synthesized using the following methodology: Ni(II) acetylacetonate is dissolved in oleylamine and heated to 110° C. under vigorous stirring, and then cooled to and maintained at 90° C. Next, a borane-triethylamine complex mixed with oleylamine is injected quickly into the solution at 90° C. and left for 1 h under vigorous stirring. The NiO nanoparticles are then washed with ethanol and finally dispersed in tetradecane. This procedure yields particles of about 4 nm in diameter. Anatase, a nanopowder of $TiO_2$ with a particle size of 3 nm and 20 nm was obtained from Sachtleben Chemie GmbH, Duisburg, Germany.

Example 3

Silver Nanoparticles and 4-Aminobenzoic Acid (pABA) Linker on a $TiO_2$ Coated Surface A conductive glass substrate (in this case ITO) surface was modified with a molecular linker, in this case terephthalic acid, obtained from Sigma-Aldrich, by simple immersion in an aqueous solution.

The conductive glass substrate modified with terephthalic acid was then immersed in an aqueous suspension of $TiO_2$ nanoparticles, in this case 3 nm anastase particles from Sachtleben Chemie GmbH. This to a monolayer coating of $TiO_2$ NPs (ITO-$TiO_2$) covalently the oxides via the linker reactive groups (—$COO^-$).

Subsequently the substrate was grafted with Ag nanoparticles previously synthesized (Example 1) in a microwave reactor (Monowave 50, Anton Paar GmbH, Austria) using pure betanin extracted from beetroots, as reducing and capping agent and subsequently modified with a linker, in this case 4-aminobenzoic acid, pABA, from Sigma-Aldrich, resulting on the deposition of a monolayer of Ag nanoparticles on the transparent substrate (ITO—$TiO_2$—Ag).

A monolayer of NiO nanoparticles (in this case 20 nm, from Sigma-Aldrich) was added to the ITO—$TiO_2$—Ag via simple immersion of the substrate in an aqueous suspension of the NiO nanoparticles. The NiO nanoparticles coordinate covalently to Ag NPs via the $COO^-$ of the linker, here pABA.

Afterwards, a 50 nm layer of Ag was evaporated as back contact electrode.

The preliminary photovoltaic characterization of the solar cell prepared according to the present disclosure shows that a photocurrent density Jsc of $1.2 \cdot 10^{-5}$ Å/$cm^2$ was generated. The open circuit Voltage Voc was 35 mV, and the Fill Factor FF 0.25. Using an overestimation of 1 μm for the active layer thickness, the current cell delivers a power of 4.2 mW/$cm^3$, with a transparency higher than 90%.

The transparency of the cell was very good, as shown in the attached photograph (FIG. 4), with no distortion of colour.

Without further elaboration, it is believed that a person skilled in the art can, using the present description, including the examples, utilize the present invention to its fullest extent. Also, although the invention has been described herein with regard to its preferred embodiments, which constitute the best mode presently known to the inventors, it should be understood that various changes and modifications as would be obvious to one having the ordinary skill in this art may be made without departing from the scope of the invention which is set forth in the claims appended hereto.

Thus, while various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

REFERENCES

Dong et al., Polyol synthesis of nanoparticles: status and options regarding metals, oxides, chalcogenides, and non-metal elements. Green Chem. 17 (2015) 4107-4132

Fernandes et al., Green microfluidic synthesis of monodispersed silver nanoparticles via genetic algorithm optimization. RSC Adv. 6 (2016) 95693-95697.

Islam et al., Effect of gold nanoparticles size on light scattering for thin film amorphous-silicon solar cells, Solar Energy 103 (2014) 263-268)

Sá, et al., Direct observation of charge separation on Au localized surface plasmon, Energy Environ. Sci. 6 (2013) 3584-3588

Zhang et al., Towards ultra-thin plasmonic silicon wafer solar cells with minimized efficiency loss, Sci. Rep. 4 (2014) 4939

The invention claimed is:

1. A plasmonic solar cell, comprising:
 a substrate;
 a layer of an n-type semiconductor;
 a layer of metal nanoparticles selected from the group consisting of copper, gold, silver and aluminium;
 a layer of a p-type semiconductor; and
 a back contact,
 wherein the n-type semiconductor, metal nanoparticles, and p-type semiconductor are sandwiched between the substrate and the back contact and linked by covalent bonds by means of a first molecular linker that modifies a surface of the n-type semiconductor and links the surface of the n-type semiconductor to the metal nanoparticles, and a second molecular linker that modifies a surface of the p-type semiconductor and links the surface of the p-type semiconductor to the metal nanoparticles; and wherein the plasmonic solar cell is transparent.

2. The solar cell according to claim 1, further comprising at least one of:
- a third molecular linker that modifies a surface of the back contact and links the surface of the back contact to a surface of the p-type semiconductor; and
- a fourth molecular linker that modifies a surface of the substrate and links the surface of the substrate to a surface of the n-type semiconductor.

3. The solar cell according to claim 1, wherein the first molecular linker and/or the second molecular linker is chosen from aromatic derivatives, short carbon chain organic compounds up to C6 or derivatives having at least one carboxylic or phosphonic group for coordination to semiconductors, or at least one amine or thiol group for coordination to the metal nanoparticles.

4. The solar cell according to claim 1, wherein the first molecular linker and/or the second molecular linker is chosen from 4-aminobenzoic acid (pABA), 4-mercaptobenzoic acid, 3-aminobenzoic acid, 3-mercaptobenzoic acid, 4-forylbenzoic acid (pFBA), (4-aminobenzyl) phosphonic acid, 2-aminobenzoic acid, 2-mercaptobenzoic acid, terephthalic acid, 4'-amino-[1,1'-biphenyl]-4-carboxylic acid, naphthalene derivatives or polyaromatic derivatives.

5. The solar cell according to claim 1, wherein the n-type semiconductor is chosen from $TiO_2$, $ZnO$, $SnO_2$, $SrTiO_3$, or a combination thereof.

6. The solar cell according to claim 1, wherein the p-type semiconductor is chosen from NiO, $CuXO_2$, wherein X=Al, Cr, Ga, Fe, or a combination thereof.

7. The solar cell according to claim 1, wherein the substrate is conductive and is chosen from indium tin oxide, fluorinated tin oxide or conductive polymers.

8. The solar cell according to claim 1, wherein the substrate is made of a transparent conductive substance.

9. The solar cell according to claim 1, wherein the metal nanoparticles are silver nanoparticles.

10. The solar cell according to claim 1, wherein the metal nanoparticles are stabilized with a stabilizing agent selected from one of betanin or a betanin derivative.

11. The solar cell according to claim 1, further comprising an insulating layer comprising an oxide chosen from $Al_2O_3$, $SiO_2$ or amorphous $TiO_2$.

12. A method for producing the plasmonic solar cell of claim 1, comprising the steps of:
   i) coating the substrate with a layer of a semiconductor which is either n-type or p-type,
   ii) modifying the metal nanoparticles with the first molecular linker and the second molecular linker,
   iii) grafting the modified metal nanoparticles from step ii) to the modified substrate from step i),
   iv) submersing the substrate from step iii) in a solution of a semiconductor of p-type when the semiconductor in step i) is n-type, and n-type, when the semiconductor in step i) is p-type, and
   v) evaporating the back contact on top of the semiconductor of step iv).

13. The method according to claim 12, wherein step i) further comprises modifying the substrate with a monolayer of a third organic molecular linker by submersing the substrate in a solution with the third organic molecular linker prior to coating the substrate with the layer of the semiconductor which is either n-type or p-type.

14. A building element comprising a solar cell according to claim 1.

15. The building element according to claim 14, wherein said element is chosen from a window, a roof element, or a wall element.

16. The plasmonic solar cell of claim 1, wherein the layer of metal nanoparticles is a monolayer.

17. The plasmonic solar cell of claim 1, wherein the first molecular linker and/or the second molecular linker is an organic molecular linker.

18. The plasmonic solar cell of claim 1, wherein the first molecular linker and the second molecular linker have the same composition.

19. The plasmonic solar cell of claim 1, wherein the first molecular linker and the second molecular linker have different compositions.

20. The plasmonic solar cell according to claim 1, wherein the first and second molecular linkers form self-assembled monolayers.

21. The plasmonic solar cell according to claim 20, wherein at least one of the self-assembled monolayers has electron-transporting properties.

22. The plasmonic solar cell according to claim 2, wherein the third molecular linker and/or the fourth molecular linker forms a self-assembled monolayer.

* * * * *